(12) United States Patent
Hung et al.

(10) Patent No.: US 9,324,833 B2
(45) Date of Patent: Apr. 26, 2016

(54) METHODS OF MANUFACTURING SEMICONDUCTOR DEVICES (71) Applicant: Taiwan Semiconductor Manufacturing Company, Ltd., Hsin-Chu (TW)

(72) Inventors: Feng-Chi Hung, Chu-Bei (TW); Jhy-Jyi Sze, Hsin-Chu (TW); Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/641,067

(22) Filed: Mar. 6, 2015

(65) Prior Publication Data
US 2015/0179761 A1 Jun. 25, 2015

Related U.S. Application Data (63) Continuation of application No. 13/250,856, filed on Sep. 30, 2011, now Pat. No. 8,994,082.

(51) Int. Cl.
| H01L 21/336 | (2006.01) |
| H01L 29/66  | (2006.01) |
| H01L 29/78  | (2006.01) |
| H01L 27/146 | (2006.01) |
| H01L 21/265 | (2006.01) |

(Continued)

(52) U.S. Cl.
CPC ...... *H01L 29/66568* (2013.01); *H01L 21/0223* (2013.01); *H01L 21/266* (2013.01); *H01L 21/26506* (2013.01); *H01L 21/26586* (2013.01); *H01L 21/2822* (2013.01); *H01L 21/28123* (2013.01); *H01L 21/76224* (2013.01); *H01L 27/1463* (2013.01); *H01L 27/14603* (2013.01); *H01L 27/14612* (2013.01); *H01L 29/0653* (2013.01); *H01L 29/41775* (2013.01); *H01L 29/42368* (2013.01); *H01L 29/78* (2013.01)

(58) Field of Classification Search
None
See application file for complete search history.

(56) References Cited

U.S. PATENT DOCUMENTS

| 5,291,049 A | 3/1994 | Morita |
| 5,950,090 A | 9/1999 | Chen et al. |

(Continued)

FOREIGN PATENT DOCUMENTS

| KR | 20010004079 A | 1/2001 |
| KR | 1020050083282 A | 8/2005 |

(Continued)

OTHER PUBLICATIONS

Martin-Gonthier, P., et al., "Customer transistor layout design techniques for random telegraph signal noise reduction in CMOS image sensors," Electronics Letters, Sep. 26, 2010, vol. 46. No. 19, IEEE, 2 pages.

*Primary Examiner* — Sonya D McCall Shepard
(74) *Attorney, Agent, or Firm* — Slater & Matsil, L.L.P.

(57) ABSTRACT

Methods of forming semiconductor devices are disclosed. In some embodiments, a first trench and a second trench are formed in a substrate, and dopants of a first conductivity type are implanted along sidewalls and a bottom of the first trench and the second trench. The first and second trenches are filled with an insulating material, and a gate dielectric and a gate electrode over the substrate, the gate dielectric and the gate electrode extending over the first trench and the second trench. Source/drain regions are formed in the substrate on opposing sides of the gate dielectric and the gate electrode.

20 Claims, 9 Drawing Sheets

(51) Int. Cl.
  *H01L 21/28* (2006.01)
  *H01L 21/02* (2006.01)
  *H01L 21/266* (2006.01)
  *H01L 21/762* (2006.01)
  *H01L 29/06* (2006.01)
  *H01L 29/417* (2006.01)
  *H01L 29/423* (2006.01)

(56) References Cited

U.S. PATENT DOCUMENTS

| | | | |
|---|---|---|---|
| 5,965,926 | A | 10/1999 | Schwalke |
| 6,399,448 | B1 | 6/2002 | Mukhopadhyay et al. |
| 6,660,595 | B2 | 12/2003 | Rodder |
| 2003/0087508 | A1 | 5/2003 | Fujiwara et al. |
| 2004/0075110 | A1 | 4/2004 | Yaung et al. |
| 2005/0090047 | A1 | 4/2005 | Hawley et al. |
| 2006/0273391 | A1 | 12/2006 | Diaz et al. |
| 2007/0164197 | A1 | 7/2007 | Boemler |
| 2009/0039390 | A1 | 2/2009 | Murthy et al. |
| 2009/0072280 | A1* | 3/2009 | Lee .................. H01L 21/28123 257/288 |
| 2009/0219422 | A1 | 9/2009 | Takeuchi et al. |
| 2010/0044801 | A1 | 2/2010 | Anderson et al. |
| 2010/0136760 | A1 | 6/2010 | Yoshie |
| 2010/0302425 | A1 | 12/2010 | Boemler |
| 2011/0013855 | A1 | 1/2011 | Ise |
| 2011/0248356 | A1 | 10/2011 | Smith |

FOREIGN PATENT DOCUMENTS

| | | |
|---|---|---|
| KR | 20090003719 A | 1/2009 |
| KR | 20110079325 A | 7/2011 |

* cited by examiner

METHODS OF MANUFACTURING SEMICONDUCTOR DEVICES

This application is a continuation application of co-pending U.S. patent application Ser. No. 13/250,856 filed on Sep. 30, 2011, entitled "Transistors, Methods of Manufacturing Thereof, and Image Sensor Circuits with Reduced RTS Noise," which application is hereby incorporated herein by reference

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). Early MOSFET processes used one type of doping to create either positive or negative channel transistors. More recent designs, referred to as complimentary MOS (CMOS) devices, use both positive and negative channel devices in complementary configurations. While this requires more manufacturing steps and more transistors, CMOS devices are advantageous because they utilize less power, and the devices may be made smaller and faster.

One type of device that can be manufactured using CMOS processes is a CMOS image sensor (CIS). One problem facing CMOS image sensors is a high amount of random telegraph signal (RTS) noise in pixel source follower transistors, which decreases the image sensor sensitivity. RTS noise is often reduced by including enlarged source follower transistors in CMOS image sensors; however, including such large devices is not feasible in some designs. Thus, what are needed in the art are improved transistor designs having low RTS noise.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to transistor designs for CMOS image sensors. Novel transistor designs, methods of manufacture thereof, and image sensor circuits that utilize the novel transistors will be described herein.

Figure 1:
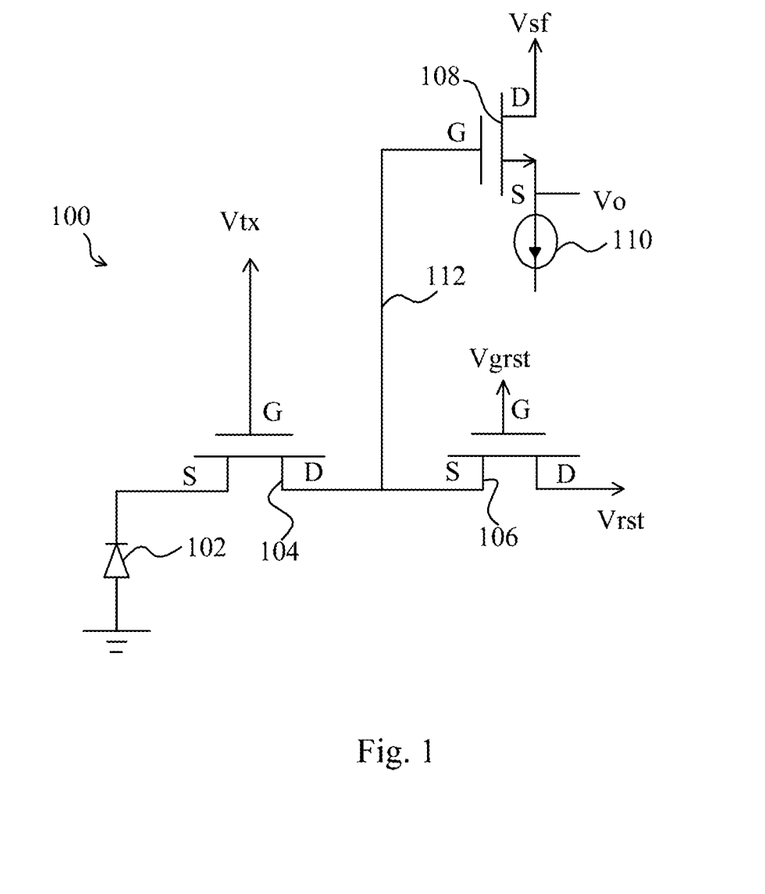
FIG. 1 is a schematic diagram of a CMOS image sensor circuit in which novel transistors of embodiments of the present disclosure may be implemented.

Referring first to FIG. 1, a schematic diagram 100 of a circuit in which a novel transistor 108 may be implemented is shown, in accordance with an embodiment of the present disclosure. The schematic diagram 100 is a circuit of an image sensor that includes a photo diode 102 and a first transistor 104 coupled to the photo diode 102. A second transistor 106 is coupled to the first transistor 104, and a third transistor 108 is coupled to the first transistor 104 and the second transistor 106, as shown. A current source 110 is coupled to the third transistor 108. A voltage threshold of the third transistor 108 is higher proximate shallow trench isolation (STI) regions 122 or 122' (not shown in FIG. 1; see FIGS. 5, 9, 12, and 13) of the third transistor 108 in accordance with embodiments of the disclosure, to be described further herein. The increased voltage threshold of the third transistor 108 proximate the STI regions 122 or 122' advantageously results in reduced RTS noise for the third transistor 108 and the image sensor circuit 100 because more current flows in a central region 150 of a channel 136 (see FIG. 13) of the third transistor 108, away from edge regions 152 which can be a source of RTS noise in source follower transistors.

The photo diode 102, the first transistor 104, the second transistor 106, and the third transistor 108 comprise CMOS devices in accordance with embodiments of the present disclosure. The third transistor 108 is also referred to herein as a transistor or a source follower transistor. The first transistor 104, the second transistor 106, and the third transistor 108 each comprise a source S, a drain D, and a gate G. A first side of the photo diode 102 is coupled to a return voltage or ground, and a second side of the photo diode 102 is coupled to the source S of the first transistor 104. The drain D of the first transistor 104 is coupled to the source S of the second transistor 106 and the gate G of the third transistor 108, e.g., by wiring 112. The source S of the third transistor 108 is coupled to the current source 110.

The third transistor 108 may comprise a source follower transistor and may be coupled to a terminal Vsf for source follower voltage at the drain D. An output voltage terminal Vo may be coupled to the source S of the third transistor 108. The first transistor 104 may comprise a transfer gate transistor and may be coupled to a terminal Vtx for a transfer gate voltage at the gate G. The second transistor 106 may comprise a reset gate transistor and may be coupled to a terminal Vgrst for a gate reset voltage at the gate G and coupled to a terminal Vrst at the drain D, as shown. Alternatively, the circuit 100 may comprise other configurations, for example.

The photo diode 102 of the image sensor circuit 100 is adapted to perform a photoelectric conversion, e.g., to accumulate a light signal charge or retrieve information regarding an image the image sensor circuit 100 is exposed to. The first transistor 104 comprising the transfer gate transistor is adapted to transfer a signal charge obtained at the photo diode 102 to the third transistor 108 comprising the source follower transistor. The third transistor 108 is adapted to read out and change an output voltage in accordance with an input voltage received at a predetermined voltage gain. The third transistor 108 may be adapted to amplify the signal transferred by the first transistor 104, for example. The second transistor 106 comprising the reset transistor is adapted to discharge a signal charge accumulated at the gate G of the second transistor 104 upon receipt of a reset signal received at voltage terminal Vgrst, for example.

The image sensor circuit 100 may comprise a read-out circuit for one pixel that includes a single photo diode 102 in an array of a plurality of pixels (not shown) of a CMOS image sensor. The array may include hundreds or thousands of pixels arranged in a matrix, each comprising an image sensor circuit 100 shown in FIG. 1, as an example. The image sensor circuit 100 may be implemented in a digital camera or other imaging devices, for example.

Figure 2:
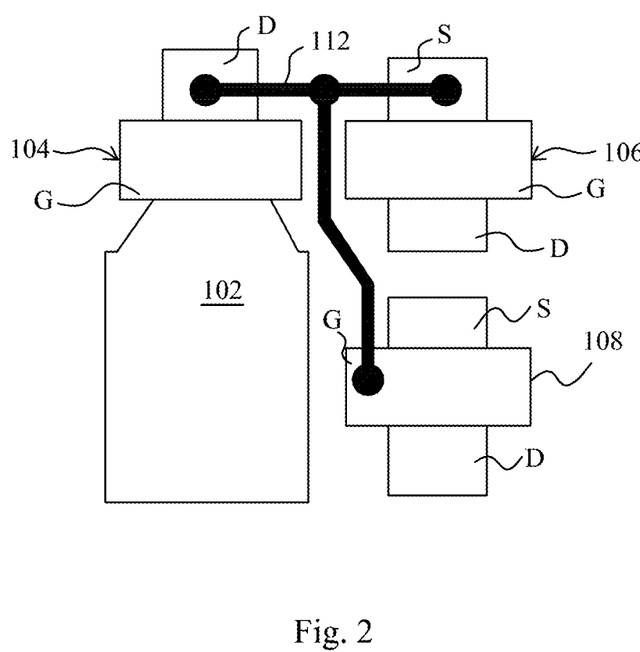
FIG. 2 is a top view of a layout of the circuit shown in FIG. 1.
Figure 3:
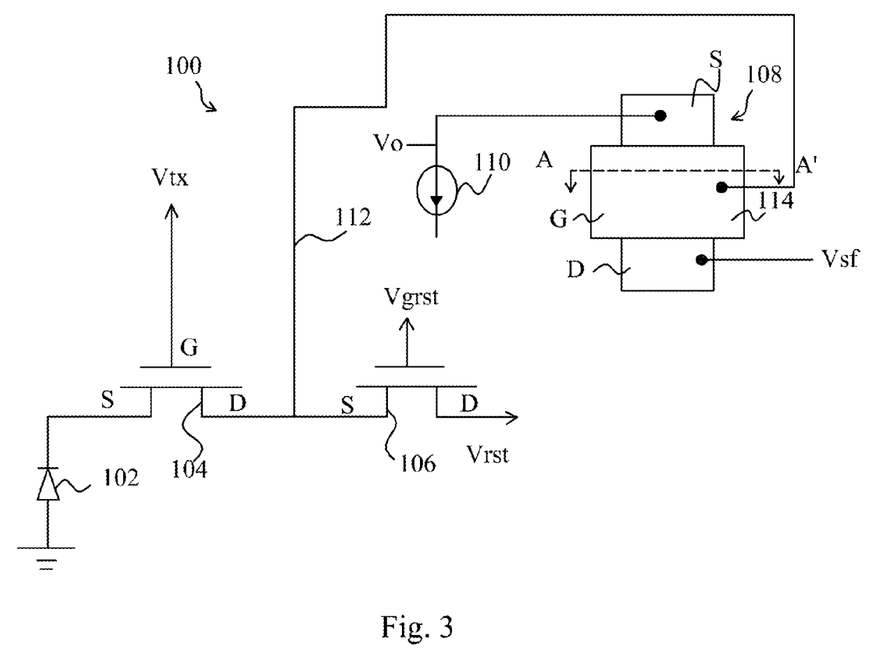
FIG. 3 is a schematic of a circuit in accordance with an embodiment, with a top view of the transistor of the present disclosure super-imposed thereon.

FIG. 2 illustrates a top view of an exemplary layout of the circuit 100 shown in FIG. 1; alternatively, the circuit 100 may comprise other layouts. FIG. 3 is a schematic of a circuit 100 in accordance with an embodiment with a top view of the transistor 108 of the present disclosure super-imposed thereon, illustrating an arrangement and connections of the source S, drain D, and gate G of the transistor 108 over a workpiece 120 (not shown in FIG. 3; see FIG. 4). Cross-sectional views of the transistor 108 at A-A' and below the gate 114 are shown in FIGS. 4 through 13, to be described further herein. Four embodiments of methods of forming transistors 108 having a high voltage threshold proximate STI regions 122 and 122' will be described herein, with reference to FIGS. 4 through 13. These embodiments illustrate alternative approaches to forming a voltage threshold modification feature, which feature will cause the voltage threshold of edge regions of the channel to be higher relative to a central region of the channel.

Figure 4:
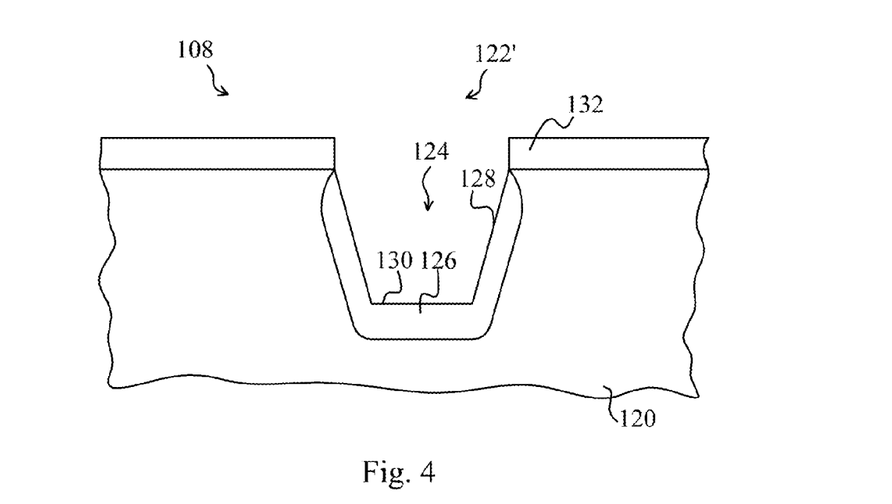
FIGS. 4 and 5 show cross-sectional views of a method of manufacturing a transistor in accordance with an embodiment.
Figure 5:
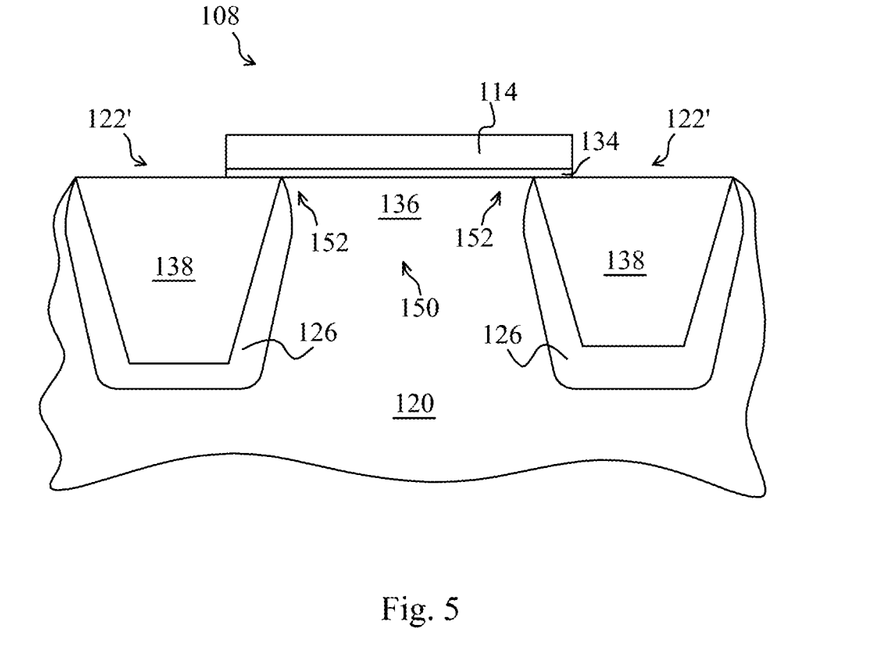

FIGS. 4 and 5 show cross-sectional views of a method of manufacturing a transistor 108 in accordance with a first embodiment, wherein STI regions 122' are implanted with a dopant on the sidewalls 128 and bottom surfaces 130 (see FIG. 4), forming an implantation region 126, before being filled with an insulating material 138 (see FIG. 5). The transistor 108 comprises a gate dielectric 134 disposed over a workpiece 120 proximate a shallow trench isolation (STI) region 122' and a gate 114 disposed over the gate dielectric 134.

To manufacture the transistor 108, a workpiece 120 is first provided, shown in FIG. 4. The workpiece 120 may include a semiconductor substrate comprising silicon or other semiconductor materials and may be covered by an insulating layer, for example. The workpiece 120 may also include other active components or circuits, not shown. The workpiece 120 may comprise silicon oxide over single-crystal silicon, for example. The workpiece 120 may include other conductive layers or other semiconductor elements, e.g., transistors, diodes, etc. Compound semiconductors, GaAs, InP, Si/Ge, or SiC, as examples, may be used in place of silicon. The workpiece 120 may comprise a silicon-on-insulator (SOI) or a germanium-on-insulator (GOI) substrate, as examples. The workpiece 120 may comprise one or more layers of electrical circuitry and/or electronic functions formed thereon, and may include conductive lines, vias, capacitors, diodes, transistors, resistors, inductors, and/or other electrical components formed in a front end of the line (FEOL) process, for example (not shown).

STI regions 122', also referred to herein as isolation regions, are formed in the workpiece 120 by forming a mask 132 over the workpiece 120, and patterning the mask 132 with a desired pattern for the STI regions 122' using lithography. The mask 132 may comprise silicon nitride or other insulating materials, for example. The mask 132 is then used as a mask during an etch process or other removal process to remove top portions of the exposed workpiece 120 and form trenches 124 for the STI region 122', as shown. The trenches 124 extend in and out of the paper lengthwise, for example. The trenches 124 comprise sidewalls 128 and a bottom surface 130. Only one trench 124 is shown in FIG. 4; however, two trenches 124 may be formed for each transistor 108 or a continuous trench may be formed encircling a region of workpiece 120 wherein transistor 108 is to be formed, as shown in FIG. 5. A plurality of trenches 124 may be formed across a surface of the workpiece 120 for an array of image sensor circuits 100, for example, not shown.

In accordance with the first embodiment, the sidewalls 128 and the bottom surface 130 of the trenches 124 are implanted with a dopant, forming an implantation region 126. The mask 132 is left remaining on the surface of the workpiece 120 during the implantation process to protect the top surface of the workpiece 120 from being implanted. The implantation process of the trenches 124 may comprise implanting B, P, or other substances at an angle of about 60 degrees or less, and in some embodiments at an angle of about 10 to 45 degrees, at a dosage of about $1 \times 10^{11}$ to $1 \times 10^{13}/cm^2$, as an example, although alternatively, other implantation processes and parameters may be used. If the third transistor 108 comprises an NMOS transistor, then B can be implanted to form an implantation region 126 comprising p-type doping; or alternatively, if the third transistor 108 comprises a PMOS transistor, then P can be implanted to form an implantation region 126 comprising n-type doping, as examples. The implantation region 126 may comprise substantially the same dopant concentration or a different dopant concentration on the bottom surface 130 and sidewalls 128.

The trenches 124 are filled with an insulating material 138, as shown in FIG. 5. The insulating material 138 may comprise silicon dioxide, silicon nitride, other insulating materials, or multiple layers or combinations thereof, as examples. Excess insulating material 138 and the mask 132 are removed from the top surface of the workpiece 120, using one or more chemical mechanical polishing and/or etch processes, exposing the top surface of the workpiece 120 and the insulating material 138. The STI regions 122' comprise the implantation regions 126 and the insulating material 138. The STI regions 122' comprise an edge higher doping concentration due to the implantation regions 126.

A gate dielectric material 134 comprising an insulating material is formed over the workpiece 120 and STI regions 122', and a gate material 114 comprising a conductive material, a semiconductive material, or multiple layers or combinations thereof is formed over the gate dielectric material 134. The gate material 114 and the gate dielectric material 134 are patterned using lithography to form a gate 114 and gate dielectric 134 of the transistor 108 disposed over the workpiece 120. The gate 114 and gate dielectric 134 extend (e.g., in and out of the paper) lengthwise along sides of the STI regions 122' in a top view. A portion of the gate 114 and gate dielectric 134 may reside over the STI regions 122' on either side, as shown. Alternatively, a portion of the gate 114 and gate dielectric 134 may not reside over a portion of the STI regions 122', for example. A channel 136 is formed beneath the gate dielectric 134 within the workpiece 120, as shown. Note that the source and drain regions S and D of the transistor 108 are into and out of the plane of the page, and the channel width 136 is illustrated from left to right in the drawings.

The implantation regions 126 increase the voltage threshold of the transistor 108 in edge regions 152 compared to center regions 150 of the channel 136 proximate the STI regions 122', preventing or reducing current flow at edge regions 152 proximate the STI regions 122' during the operation of the transistor 108 and reducing RTS noise, advantageously. The higher doping concentration of the implantation regions 126 at the STI region 122' edges, e.g., at the well of the STI region 122', causes current to tend not to flow at the STI region 122' edge, for example.

Figure 6:
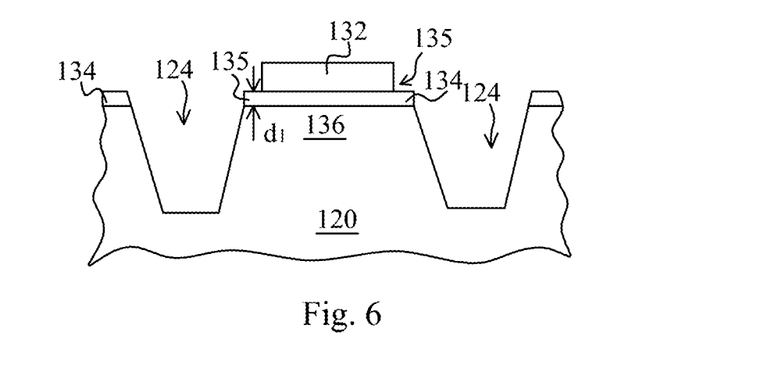
FIGS. 6 and 7 show cross-sectional views of a method of manufacturing a transistor in accordance with another embodiment.
Figure 7:
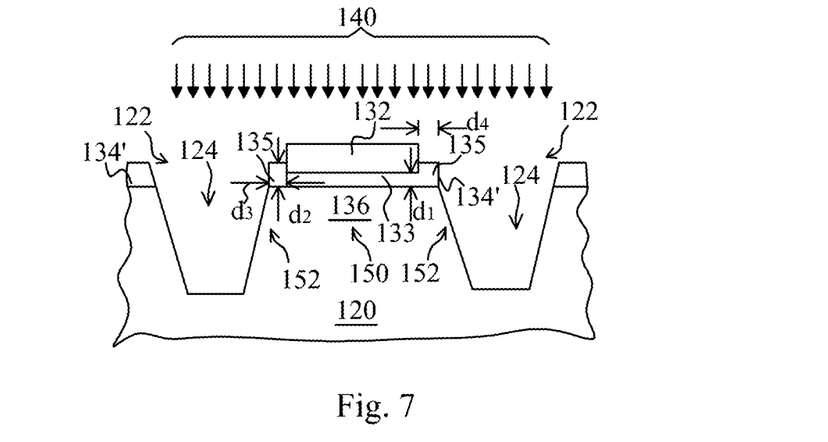

FIGS. 6 and 7 show cross-sectional views of a method of manufacturing a transistor 108 in accordance with a second embodiment. Like numerals are used for the various elements in FIGS. 6 and 7 (and also in FIGS. 8 through 13) that were used to describe FIGS. 1 through 5. To avoid repetition, each reference number shown in FIGS. 6 and 7 is not described again in detail herein. Rather, similar materials 100, 102, 104, 106 etc., are used to describe the various material layers and components shown as were used to describe the previous FIGS. 1 through 5.

In this embodiment, edge regions 135 of the gate dielectric 134' along the length of the gate 114 are increased in thickness to achieve a higher voltage threshold proximate the STI regions 122 than in central regions 133 of the gate dielectric 134' proximate the central regions 150 of the channel 136.

To increase the thickness of the gate dielectric 134, the gate dielectric material 134 is formed over the workpiece 120. In the embodiment shown, the STI region 122 trenches 124 have not yet been filled with an insulating material 138; alternatively, the trenches 124 may be filled with an insulating material 138 (see FIG. 5) prior to forming the gate dielectric material 134, for example, not shown. The gate dielectric material 134 may be deposited or grown over the workpiece 120, for example. The gate dielectric material 134 has a thickness comprising dimension $d_1$ as initially formed, wherein dimension $d_1$ comprises about 20 to 100 Angstroms, for example. Alternatively, dimension $d_1$ may comprise other values.

A mask 132 is formed over the gate dielectric material 134, as shown in FIG. 6. The mask 132 may comprise silicon nitride or other materials, for example. The mask 132 is patterned and used as a mask during an etch process which forms the gate dielectric 134 and optionally also forms the trenches 124 for the STI regions 122 in this embodiment, for example. The mask 132 is exposed to an etch-back process or pull-back process, removing a portion of the mask 132 from the top surface of edge regions 135 of the gate dielectric 134 and optionally from other regions of the workpiece 120, as shown in FIG. 6.

The workpiece 120 is then exposed to an implantation process 140, as shown in FIG. 7, which comprises implanting a substance into the gate dielectric 134 in the edge regions 135. The substance implanted comprises Ar in some embodiments, for example. In these embodiments, a thermal oxidation process may then be used to increase the thickness of the gate dielectric 134 in the edge regions 135. The substance implanted may also comprise an oxide, as another example, which increases the thickness of the gate dielectric 134' in the edge regions 135.

The thickness of the gate dielectric 134' in the edge regions 135 may comprise a dimension $d_2$, wherein dimension $d_2$ comprises about 30 to 120 Angstroms, for example. Alternatively, dimension $d_2$ may comprise other values. In some embodiments, dimension $d_2$ is about 10 to 30% greater than dimension $d_1$, for example.

Figure 8:
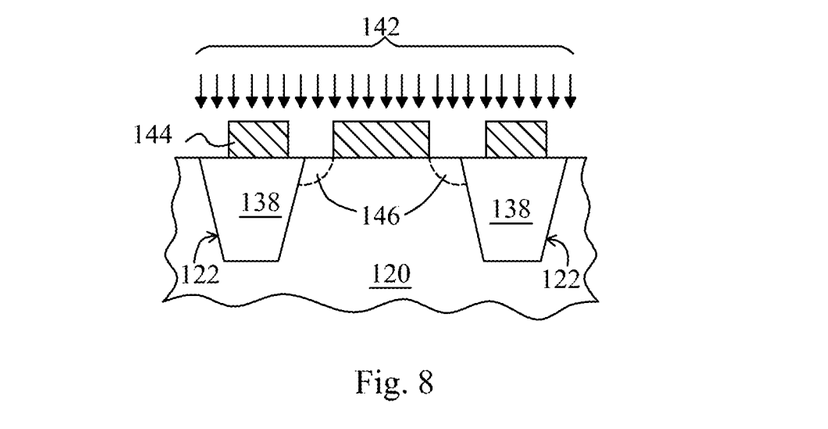
FIGS. 8 and 9 show cross-sectional views of a method of manufacturing a transistor in accordance with yet another embodiment.

FIGS. 8 and 9 show cross-sectional views of a method of manufacturing a transistor 108 in accordance with yet another embodiment. The thickness of the gate dielectric 134' proximate the STI regions 122 is increased in this embodiment by forming a masking material 144 over the workpiece 120, before forming the gate dielectric material 134', as shown in FIG. 8. The masking material 144 is patterned, exposing portions of the workpiece 120 proximate the STI regions 122. Note that the STI regions 122 comprise only an insulating material 138 and not the implantation regions 126 shown in the first embodiment. A substance is then implanted into the workpiece 120 proximate the STI regions 122 using an implantation process 142, and the masking material 144 is removed. The implantation process 142 may comprise implanting Ar in some embodiments, for example. The implantation process 142 results in the formation of implantation regions 146 in regions of the workpiece 120 proximate the STI regions 122, as shown.

Figure 9:
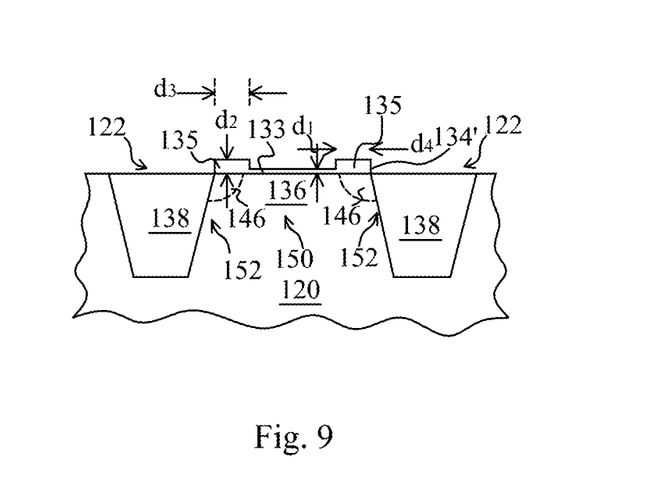

The gate dielectric material 134' is then deposited or formed over the workpiece 120, as shown in FIG. 9. The gate dielectric material 134' may be formed using an oxidation process or other methods, for example. The presence of the implanted substance in implantation regions 146 results in a thicker gate dielectric 134' in edge regions 135 being formed, due to the presence of the underlying implanted substance in implantation regions 146, as shown.

The gate dielectric 134' may be formed using a thermal oxidation process, for example, and the presence of the implanted Ar causes an increased thickness of gate dielectric 134' over the implantation regions 146 at the edge regions 135 compared to non-implanted regions of the workpiece 120 where the gate dielectric 134' formed is thinner. Implanted argon ions in a substrate enhance oxide growth, for example.

The increased thickness of the gate dielectric 134' proximate the edges of the isolation regions 122 results in an increase in the voltage threshold of the transistor 108 in the second and third embodiments shown in FIGS. 6, 7, 8 and 9 proximate the isolation regions 122. The gate dielectric 134' edge regions 135 proximate the STI regions 122 may comprise a thickness of dimension $d_2$ that is about 10 to 30% greater than a thickness comprising dimension $d_1$ of the gate dielectric 134' in the central region 133, e.g., disposed over the central region 150 of the channel 136 of the transistor 108, in some embodiments. The edge regions 135 may comprise a distance apart from the STI regions 122 on sides of the gate dielectric 134' comprising dimensions $d_3$ and $d_4$, wherein dimensions $d_3$ and $d_4$ may be about 0.03 μm to 0.1 μm, for example, although alternatively, dimension $d_3$ may comprise other values. Dimensions $d_3$ and $d_4$ may comprise substantially the same value or may comprise different values in other embodiments, for example. The thicker gate dielectric 134' edge regions 135 along the gate 114 length increases the voltage threshold at the STI region 122 edge so that current tends not to flow at the STI region 122 edge. The higher voltage threshold of the transistor 108 proximate the isolation regions 122 results in reduced RTS noise.

Figure 10:
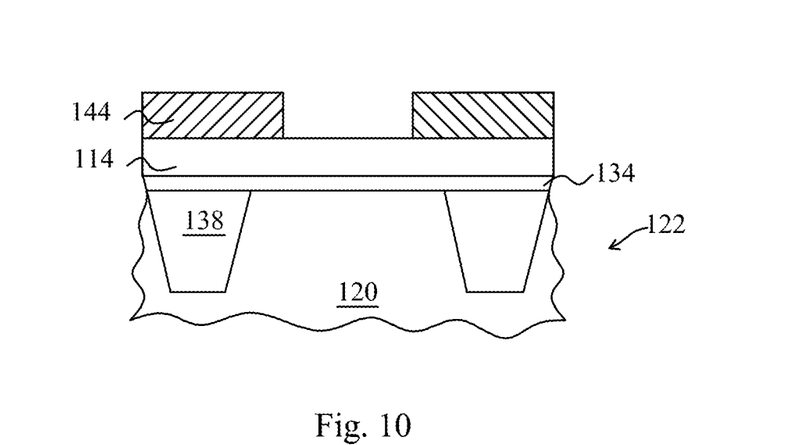
FIGS. 10 through 12 show cross-sectional views of a method of manufacturing a transistor in accordance with another embodiment.
Figure 11:
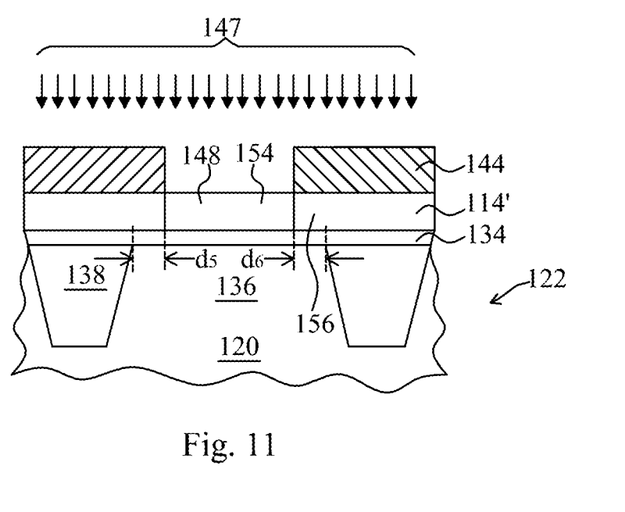
Figure 12:
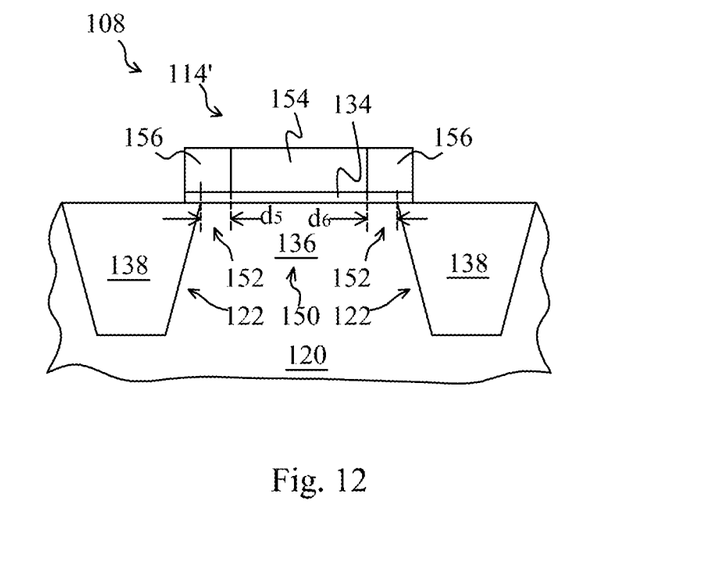

FIGS. 10 through 12 show cross-sectional views of a method of manufacturing a transistor 108 in accordance with a fourth embodiment. The gate 114' comprises a greater amount of implanted dopants in a central region 154 of the gate 114' than in edge portions 156 of the gate 114' proximate the STI regions 122 in this embodiment. After the formation of STI regions 122 comprising insulating material 138 in the workpiece 120, a gate dielectric material 134 is formed over the workpiece 120 and STI regions 122, as shown in FIG. 10. A gate material 114 that may comprise a semiconductive material such as polysilicon or other materials is formed over the gate dielectric material 134. The gate material 114 may be undoped or lightly doped, for example. The gate material 114 may be lightly doped with N+ material at a concentration of about $1 \times 10^{11}$ to $1 \times 10^{12}/cm^2$, as an example, although other doping concentrations and materials may also be used. A mask 144 that may comprise a photoresist or a combination of a photoresist and a hard mask, as examples, is deposited over the gate material 114, as shown. The mask 144 is patterned using lithography to open a region in the mask 144 over the gate material 114.

The workpiece 120 is exposed to an implantation process 147 to form a higher doping concentration in a central region 154 of the gate 114' than in edge regions 156, as shown in FIG. 11. The implantation process 127 may comprise implanting B, P, or As at about 10 Kev to 200 Kev at a dosage of about $1 \times 10^{14}$ to $1 \times 10^{15}/cm^2$, as examples, although alternatively, other implantation processes and parameters may be used. The edge regions 156 may comprise a distance apart from the STI regions 122 on sides of the channel 136 comprising dimensions $d_5$ and $d_6$, wherein dimensions $d_5$ and $d_6$ may be about 0.03 μm to 0.1 μm, for example, although alternatively, dimensions $d_5$ and $d_6$ may comprise other values. Dimensions $d_5$ and $d_6$ may comprise substantially the same value or may comprise different values in other embodiments, for example. The gate material 114' and the gate dielectric 134 are then patterned, leaving the transistor 108 shown in FIG. 12 including gate 114' that has been altered to have a lower doping concentration at edge regions 156 than at the central region 154. The lower doping concentration at edge regions 156 of the gate 114' along the gate 114' length increases the voltage threshold of the transistor 108 proximate edges of the STI region 122 and proximate the edge regions 152 of the channel 136 so that current tends not to flow through the STI region 122 edges, which reduces or eliminates RTS noise, advantageously.

Figure 13:
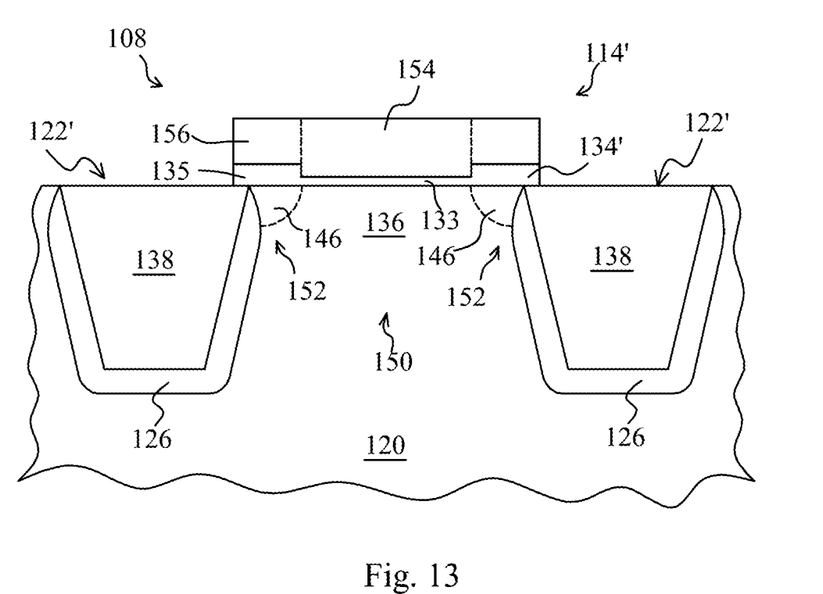
FIG. 13 shows a cross-sectional view of a transistor in accordance with yet another embodiment of the present disclosure.

FIG. 13 shows a cross-sectional view of a transistor 108 in accordance with yet another embodiment. Combinations of the four embodiments previously described may be implemented in a transistor 108 in accordance with the present disclosure. In the embodiment shown, the first embodiment shown in FIGS. 4 and 5, and the fourth embodiment shown in FIGS. 10 through 12 have been implemented to achieve an STI region 122' comprising implantation region 126 and insulating material 138, and a gate 114' having a central region 154 with a high doping concentration, respectively. Either the second embodiment shown in FIGS. 6 and 7, or the third embodiment shown in FIGS. 8 and 9 has also been implemented to achieve a gate dielectric 134' that is thicker at the edge regions 135 than at the center regions 133. Likewise, any two or more of the embodiments may be implemented in the manufacturing process of a transistor 108 in other combinations.

Portions of the workpiece 120 may be masked during the various manufacturing processes for the third transistors 108 described herein in some embodiments. In other embodiments, other portions of the CMOS image sensor circuit 100 may be simultaneously formed during the manufacturing of the third transistors 108, such as portions of the photo diode 102, the first transistor 104, the second transistor 106, wiring 112, and other elements of the circuit 100, not shown.

Advantages of embodiments of the disclosure include providing novel transistor 108 designs that have reduced RTS noise and that do not require that their size (e.g., the gate 114/114' size in a top view) be increased to reduce the RTS noise. Embodiments have been described herein wherein an STI region 122', a gate dielectric 134', and/or a gate 114' are modified or altered to achieve a higher voltage threshold proximate edge regions 152 of a channel 136, proximate STI regions 122/122', than at a central region 150 of the channel 136, so that a greater amount of current is passed through the central region 150 of the channel 136 during operation of the transistor 108, which reduces RTS noise by avoiding or reducing current flow in edge regions 152 of the channel 136, advantageously. The higher voltage thresholds at the edges of the STI regions 122/122' cause current flow through the source follower transistor 108 gate to avoid the STI region 122/122' edge.

The novel transistors 108 are easily implementable in manufacturing process flows for image sensor circuits 100. The transistors 108 described herein having a higher voltage threshold at the STI region 122/122' edges are particularly useful in reducing or eliminating RTS noise when used as source follower transistors of CMOS image sensors or active pixel sensors (APSs), for example. A voltage applied to the transistors 108 creates a greater amount of current through the central region 150 of the channel 136 than in the edge regions 152 of the channel 136.

Figure 14:
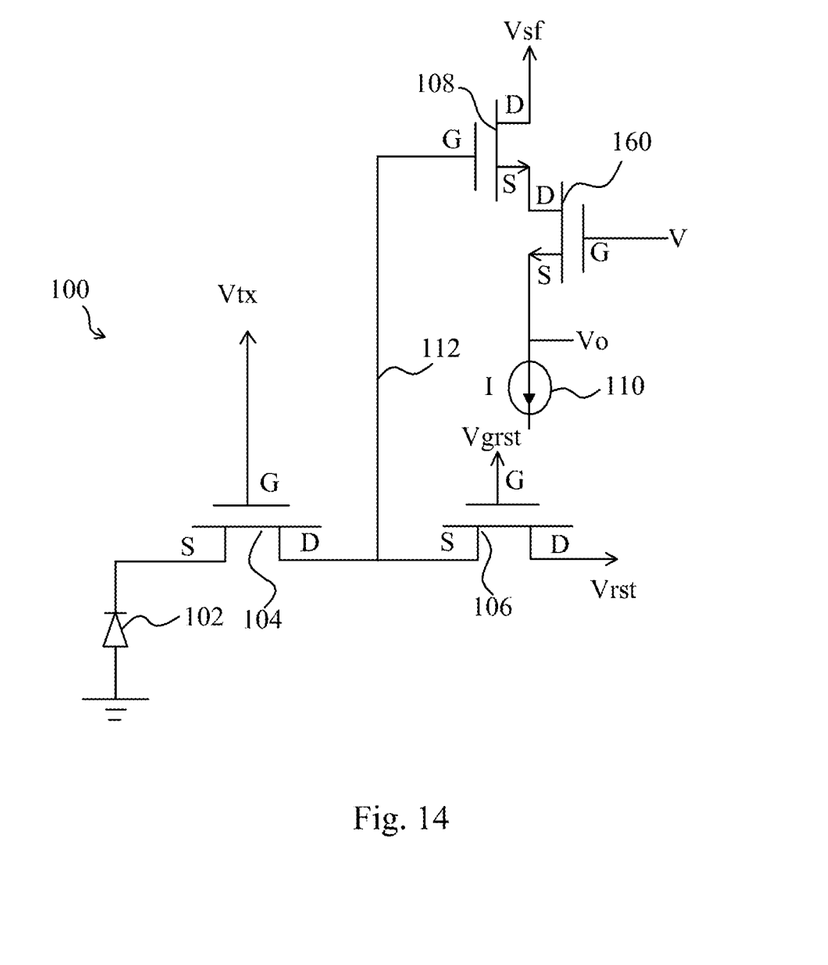
FIG. 14 is a schematic diagram of another CMOS image sensor circuit in which the novel transistors of embodiments of the present disclosure may be implemented, wherein a row select transistor is included in the circuit.

Embodiments of the present disclosure also have useful application in other types of APSs. As an example, embodiments may be implemented in an APS having a row select transistor 160 coupled thereto, as shown in FIG. 14, which is a schematic diagram 100 of another CMOS image sensor circuit in which the novel transistors of embodiments of the present disclosure may be implemented, wherein a source follower transistor 108 described herein is included in the APS circuit. The row select transistor 160 comprises a fourth transistor of the circuit that is coupled between the source follower transistor 108 and the current source 110, as shown. The source S of the source follower transistor 108 is coupled to a drain D of the row select transistor 160, and a source S of the row select transistor 160 is coupled to the current source 110. An output voltage terminal Vo may be coupled to the source S of the row select transistor 160. A voltage V may be applied to a gate G of the row select transistor 160 to select a row of pixels in an array of pixels, for example.

Embodiments of the present disclosure include the novel transistor 108 designs and methods of manufacturing the transistors 108 described herein. Embodiments of the present disclosure also include image sensor circuits 100 that include the transistors 108 described herein.

In accordance with one embodiment of the present disclosure, a transistor includes a channel disposed between two isolation regions in a workpiece. The channel has edge regions proximate the isolation regions and a central region between the edge regions. The transistor includes a gate dielectric disposed over the channel, and a gate disposed over the gate dielectric. The transistor includes a voltage threshold modification feature proximate the edge regions configured to increase a voltage threshold of the transistor proximate edge regions relative to the central region of the channel.

In accordance with another embodiment, a method of manufacturing a transistor includes providing a workpiece, patterning the workpiece to form two isolation regions in the workpiece, and forming a gate dielectric over the workpiece between the isolation regions. A gate is formed over the gate dielectric, and a voltage threshold modification feature is formed proximate the isolation regions.

In accordance with yet another embodiment, an image sensor circuit includes a photo diode, a first transistor coupled to the photo diode, and a second transistor coupled to the first transistor. A third transistor is coupled to the first transistor and the second transistor. The third transistor includes a channel disposed between two isolation regions in a workpiece, a gate dielectric disposed over the channel, and a gate disposed over the gate dielectric. A voltage threshold of the third transistor is higher proximate the isolation regions than in a central region of the channel.

Transistors, methods of manufacturing thereof, and image sensor circuits with reduced random telegraph signal (RTS) noise are disclosed. In one embodiment, a transistor includes a channel disposed between two isolation regions in a workpiece. The channel has edge regions proximate the isolation regions and a central region between the edge regions. The transistor includes a gate dielectric disposed over the channel, and a gate disposed over the gate dielectric. The transistor includes a voltage threshold modification feature proximate the edge regions configured to increase a voltage threshold of the transistor proximate edge regions relative to the central region of the channel.

In accordance with yet another embodiment, a method of forming a semiconductor device is provided. The method includes forming a first trench and a second trench in a substrate, and implanting dopants of a first conductivity type along sidewalls and a bottom of the first trench and the second trench. The first trench and the second trench is filled with an insulating material. A gate dielectric and a gate electrode is formed over the substrate, wherein the gate dielectric and the gate electrode extend over the first trench and the second trench. Source/drain regions are formed in the substrate on opposing sides of the gate dielectric and the gate electrode.

In accordance with yet still another embodiment, a method of forming a semiconductor device is provided. The method includes forming a first trench and a second trench in a substrate, and forming a gate dielectric and a gate electrode over the substrate between the first trench and the second trench. Source/drain regions are formed in the substrate on opposing sides of the gate dielectric and the gate electrode, wherein the gate electrode has a gate length extending between the source/drain regions, and a gate width perpendicular to the gate length. The gate electrode includes a first electrode peripheral region, a second electrode peripheral region, and a central electrode region interposed between the first electrode peripheral region and the second peripheral region along a direction of the gate width, wherein the gate electrode is doped such that a dopant concentration in the first electrode peripheral region and the second electrode peripheral region is less than a dopant concentration in the central electrode region.

In yet still another embodiment, a method of forming a semiconductor device is provided. The method includes forming a first trench and a second trench in a substrate, and forming a gate dielectric between the first trench and the second trench. The gate dielectric has a first dielectric peripheral region closest to the first trench, a second dielectric peripheral region closest to the second trench, and a central dielectric region interposed between the first dielectric peripheral region and the second dielectric peripheral region, wherein the first dielectric peripheral region and the second dielectric peripheral region extend over an uppermost surface of the substrate immediately adjacent the first trench and the second trench, respectively. The gate dielectric has a first thickness in the first peripheral region, a second thickness in the second dielectric peripheral region, and a third thickness in the central dielectric region, wherein the first thickness and the second thickness is greater than the first thickness. A gate electrode is formed over the gate dielectric, and source/drain regions are formed in the substrate on opposing sides of the gate dielectric and the gate electrode. The gate electrode has a gate length that extends between the source/drain regions, and a gate width perpendicular to the gate length, wherein the gate width extends in a direction from the first trench to the second trench.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
   forming a first trench and a second trench in a substrate;
   implanting dopants of a first conductivity type along sidewalls and a bottom of the first trench and the second trench;
   filling the first trench and the second trench with an insulating material, an upper surface of the insulating material in the first trench and the second trench being substantially planar;
   forming a gate dielectric and a gate electrode over the substrate, the gate dielectric and the gate electrode extending over the first trench and the second trench, wherein the gate dielectric comprises a first dielectric peripheral region, a second dielectric peripheral region, and a central dielectric region interposed between the first dielectric peripheral region and the second dielectric peripheral region, and wherein the forming the gate dielectric comprises forming the gate dielectric such that a thickness of the first dielectric peripheral region and the second dielectric peripheral region is greater than a thickness of the central dielectric region; and
   forming source/drain regions in the substrate on opposing sides of the gate dielectric and the gate electrode.

2. The method of claim 1, wherein the implanting is performed at an angle of about 60 degrees or less.

3. The method of claim 1, wherein forming the gate electrode comprises:
doping the gate electrode such that a central electrode region has a higher concentration of dopants of a second conductivity type than a first electrode peripheral region and a second electrode peripheral region, the central electrode region being interposed between the first electrode peripheral region and the second electrode peripheral region, the first electrode peripheral region extending over the first trench and the second electrode peripheral region extending over the second trench.

4. The method of claim 1, wherein the forming the gate dielectric such that a thickness of the first dielectric peripheral region and the second dielectric peripheral region is greater than a thickness of the central dielectric region comprises implanting Ar into the gate dielectric in the first dielectric peripheral region and the second dielectric peripheral region.

5. The method of claim 1, wherein the forming the gate dielectric such that a thickness of the first dielectric peripheral region and the second dielectric peripheral region is greater than a thickness of the central dielectric region comprises implanting Ar into the substrate below the gate dielectric in the first dielectric peripheral region and the second dielectric peripheral region.

6. A method of forming a semiconductor device, the method comprising:
forming a first trench and a second trench in a substrate;
forming a gate dielectric and a gate electrode over the substrate between the first trench and the second trench;
forming source/drain regions in the substrate on opposing sides of the gate dielectric and the gate electrode, the gate electrode having a gate width and a gate length, the gate length extending between the source/drain regions, and the gate width being perpendicular to the gate length, the gate electrode comprises a first electrode peripheral region, a second electrode peripheral region, and a central electrode region interposed between the first electrode peripheral region and the second peripheral region along a direction of the gate width; and
doping the gate electrode such that a dopant concentration in the first electrode peripheral region and the second electrode peripheral region is less than a dopant concentration in the central electrode region.

7. The method of claim 6, wherein doping the gate electrode comprises:
forming a gate electrode layer;
forming a mask over the gate electrode layer;
patterning the mask to expose the central electrode region; and
implanting dopants into the central electrode region.

8. The method of claim 6, wherein the gate dielectric comprises a first dielectric peripheral region, a second dielectric peripheral region, and a central dielectric region interposed between the first dielectric peripheral region and the second dielectric peripheral region, and wherein the forming the gate dielectric comprises forming the gate dielectric such that a thickness of the first dielectric peripheral region and the second dielectric peripheral region is greater than a thickness of the central dielectric region.

9. The method of claim 8, wherein the forming the gate dielectric such that a thickness of the first dielectric peripheral region and the second dielectric peripheral region is greater than a thickness of the central dielectric region comprises:
masking the central dielectric region such that the first dielectric peripheral region and the second dielectric peripheral region are exposed;
implanting a material into the first dielectric peripheral region and the second dielectric peripheral region; and
performing an oxidation process on the first dielectric peripheral region and the second dielectric peripheral region, the oxidation process increasing a thickness of the first dielectric peripheral region and the second dielectric peripheral region relative to the central dielectric region.

10. The method of claim 9, the first dielectric peripheral region extends over the first trench and the second dielectric peripheral region extends over the second trench.

11. The method of claim 8, wherein the forming the gate dielectric such that a thickness of the first dielectric peripheral region and the second dielectric peripheral region is greater than a thickness of the central dielectric region comprises:
masking a portion of the substrate interposed between the first trench and the second trench, an upper surface of the substrate immediately adjacent the first trench and the second trench being exposed;
implanting a material into exposed portions of the substrate immediately adjacent the first trench and the second trench; and
performing an oxidation process, the material causing a thicker oxide to be formed over in the first dielectric peripheral region and the second dielectric peripheral region relative to the central dielectric region.

12. The method of claim 11, the first dielectric peripheral region extends over the first trench and the second dielectric peripheral region extends over the second trench.

13. The method of claim 6, further comprising:
implanting dopants along sidewalls and a bottom of the first trench and the second trench, the dopants having a conductivity type opposite a conductivity type of the source/drain regions; and
filling the first trench and the second trench with an insulating material.

14. A method of forming a semiconductor device, the method comprising:
forming a first trench and a second trench in a substrate;
forming a gate dielectric between the first trench and the second trench, the gate dielectric having a first dielectric peripheral region closest to the first trench, a second dielectric peripheral region closest to the second trench, and a central dielectric region interposed between the first dielectric peripheral region and the second dielectric peripheral region, the first dielectric peripheral region and the second dielectric peripheral region extending over an uppermost surface of the substrate immediately adjacent the first trench and the second trench, respectively, the gate dielectric having a first thickness in the first peripheral region, a second thickness in the second dielectric peripheral region, and a third thickness in the central dielectric region, the first thickness and the second thickness being greater than the first thickness;
forming a gate electrode over the gate dielectric; and
forming source/drain regions in the substrate on opposing sides of the gate dielectric and the gate electrode, the gate electrode having a gate width and a gate length, the gate length extending between the source/drain regions, and the gate width being perpendicular to the gate length, the gate width extending in a direction from the first trench to the second trench.

15. The method of claim 14, wherein the forming the gate dielectric comprises:
forming a dielectric layer;
masking the central dielectric region such that the first dielectric peripheral region and the second dielectric peripheral region are exposed;
implanting a material into the first dielectric peripheral region and the second dielectric peripheral region; and
performing an oxidation process on the first dielectric peripheral region and the second dielectric peripheral region, the oxidation process increasing a thickness of the first dielectric peripheral region and the second dielectric peripheral region relative to the central dielectric region.

16. The method of claim 14, wherein the forming the gate dielectric comprises:
masking a portion of the substrate interposed between the first trench and the second trench, an upper surface of the substrate immediately adjacent the first trench and the second trench being exposed;
implanting a material into exposed portions of the substrate immediately adjacent the first trench and the second trench; and
performing an oxidation process, the material causing a thicker oxide to be formed over in the first dielectric peripheral region and the second dielectric peripheral region relative to the central dielectric region.

17. The method of claim 14, doping the gate electrode such that a dopant concentration in a first electrode peripheral region and a second electrode peripheral region is less than a dopant concentration in a central electrode region.

18. The method of claim 17, further comprising:
implanting dopants along sidewalls and a bottom of the trenches, the dopants having a conductivity type opposite a conductivity type of the source/drain regions; and
filling the first trench and the second trench with an insulating material.

19. The method of claim 2, wherein the implanting is performed at a dosage of about $1 \times 10^{11}$ to $1 \times 10^{13}/cm^2$.

20. The method of claim 3, wherein the doping is performed at a dosage of about $1 \times 10^{14}$ to $1 \times 10^{15}/cm^2$.

* * * * *